(12) United States Patent
Sugawara

(10) Patent No.: US 7,643,350 B2
(45) Date of Patent: ***Jan. 5, 2010

(54) NONVOLATILE SEMICONDUCTOR MEMORY DEVICE AND METHOD OF WRITING DATA INTO THE SAME

(75) Inventor: Hiroshi Sugawara, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/273,141

(22) Filed: Nov. 18, 2008

(65) Prior Publication Data

US 2009/0086546 A1    Apr. 2, 2009

Related U.S. Application Data

(63) Continuation of application No. 11/671,853, filed on Feb. 6, 2007, now Pat. No. 7,468,917.

(30) Foreign Application Priority Data

Feb. 8, 2006    (JP)    .............................. 2006-030717

(51) Int. Cl.
*G11C 11/34* (2006.01)
(52) U.S. Cl. ........................... 365/185.24; 365/185.14; 365/185.18; 365/185.22

(58) Field of Classification Search ............. 365/185.18, 365/185.14, 185.13, 185.22, 185.24
See application file for complete search history.

(56) References Cited

U.S. PATENT DOCUMENTS

| | | | |
|---|---|---|---|
| 6,452,837 B2 | 9/2002 | Mori et al. | |
| 6,738,291 B2* | 5/2004 | Kamei et al. | 365/185.18 |
| 6,888,752 B2* | 5/2005 | Mangan et al. | 365/185.11 |
| 6,937,522 B2* | 8/2005 | Funaki | 365/185.22 |
| 7,088,616 B2 | 8/2006 | Tanaka et al. | |
| 7,376,019 B2 | 5/2008 | Hashimoto et al. | |
| 7,411,819 B2 | 8/2008 | Takeuchi | |
| 7,468,917 B2* | 12/2008 | Sugawara | 365/185.24 |

FOREIGN PATENT DOCUMENTS

| | | |
|---|---|---|
| JP | 2001-52486 A | 2/2001 |
| JP | 2003-123491 A | 4/2003 |
| JP | 2005-235287 A | 9/2005 |

* cited by examiner

*Primary Examiner*—Tuan T Nguyen
*Assistant Examiner*—Hien N Nguyen
(74) *Attorney, Agent, or Firm*—Sughrue Mion, PLLC

(57) ABSTRACT

In a nonvolatile semiconductor memory device, a memory cell array has a plurality of nonvolatile memory cells arranged in a matrix. A selecting section selects as selection memory cells, at least two of the plurality of nonvolatile memory cells from the memory cell array. A write section applies to the selection memory cells, a gate voltage which increases step by step, until a threshold voltage of each of the selection memory cells reaches a target threshold voltage, such that the threshold voltage increases step-by-step.

6 Claims, 13 Drawing Sheets

NONVOLATILE SEMICONDUCTOR MEMORY DEVICE AND METHOD OF WRITING DATA INTO THE SAME

This is a continuation of application Ser. No. 11/671,853 filed Feb. 6, 2007, which claims priority from Japanese Application No. 2006-030717, filed Feb. 8, 2006. The entire disclosure of the prior application is hereby incorporated by reference.

BACKGROUND OF THE INVENTION

1. Field of the Invention

The present invention relates to a nonvolatile semiconductor memory device and a method of writing data into the same.

2. Description of the Related Art

A nonvolatile semiconductor memory device is known, such as a flash memory of an NOR type in which flash memory cells using CHE (Channel Hot Electron) are arranged in a matrix. FIG. 1 is a block diagram showing the configuration of a conventional nonvolatile semiconductor memory device 101. The nonvolatile semiconductor memory device 101 contains a memory cell array 102, a decoder 103, a column switch circuit 104, a power supply circuit 105, a write circuit 106, a sense amplifier circuit 107, an address data buffer 108 and a control circuit 110.

The memory cell array 102 contains a plurality of memory cells (not shown) arrayed in a matrix, a plurality of bit lines (not shown) extending in a Y-direction and connected to the column switch circuit 104, a plurality of word lines (not shown) extending in an X-direction and connected to the decoder 103, and a plurality of source lines (not shown) extending in the Y-direction and grounded. The memory cell is a flash memory cell of an NOR type that uses CHE (Channel Hot Electron). The memory cell array 102 is divided into a plurality of regions 102-0 to 102-15 in accordance with the number of bits of a data, for example, 16 bits.

The decoder 103 selects as a selection word line, one from among a plurality of word lines in accordance with an address signal from the address data buffer 108. The column switch circuit 104 selects as a selection bit line, one from among the plurality of bit lines in each of the plurality of regions 102-0 to 102-15 in accordance with the address signal from the address data buffer 108 through the decoder 103. That is, in the example shown in FIG. 1, a total of 16 selection bit lines are selected at a same time. A selection cell as one of the plurality of memory cells is determined on the basis of the selection word line and the selection bit line.

The power supply circuit 105 applies a word line voltage (gate voltage) determined in accordance with a control signal from the control circuit 110, to the selection word line through the decoder 103. Also, the power supply circuit 105 has a function of a charge pump for supplying a write current to the write circuit 106. The write circuit 106 supplies the write current to each of the plurality of selection bit lines through the column switch circuit 104. Thus, a data is written to each of 16 selection cells.

The sense amplifier circuit 107 outputs a write state (a threshold voltage) of the selection cell to the control circuit 110 through the address data buffer 108. The address data buffer 108 transiently stores the data. The control circuit 110 outputs the address signal of the memory cells to which the write operation is performed and the write data to the address data buffer 108 and the control signal to the power supply circuit 105.

FIG. 2 is a block diagram showing the detailed configuration of the conventional nonvolatile semiconductor memory device. It should be noted that in FIG. 2, the sense amplifier circuit 107 and the address data buffer 108 are omitted.

In the memory cell array 102, the plurality of regions 102-0 to 102-15 have a plurality of common word lines W0 to Wn (n is an integer, and hereinafter, it is similar). Also, each 102-i (i=an integer of 0 to 15, and hereinafter, it is similar) of the plurality of regions 102-0 to 102-15 has a plurality of memory cells MCi arrayed in a matrix and a plurality of bit lines BLi connected to the column switch circuit 104.

The decoder 103 contains a row decoder 131 and a column decoder 132. The row decoder 131 selects the selection word line Ws from among the plurality of word lines W0 to Wn in accordance with the address signal from the control circuit 110. The column decoder 132 decodes the address signal from the control circuit 110 and supplies to the column switch circuit 104. The column switch circuit 104 selects the selection bit line BLi from among the plurality of bit lines BLi in accordance with the decoded address signal in each region 102-i.

The write circuit 106 contains a plurality of write circuits 161-0 to 161-15. Each write circuit 161-i is used for the region 102-i, and connected to the selection bit line BLi of the region 102-i through the column switch circuit 104. Each write circuit 161-i supplies the write current to the selection bit line BLi in accordance with the write data.

The control circuit 110 contains a write control circuit 121 and a detecting circuit 122. The detecting circuit 122 detects the number of the memory cells to which the write operation is performed at a same time in accordance with the address signal and the write data. Then, the detecting circuit 122 outputs a detection signal indicating the number of memory cells, the address signal and the write data to the write control circuit 121. The write control circuit 121 controls the operations of the plurality of write circuits 161-0 to 161-15 in accordance with the detection signal, the address signal and the write data. Also, the write control circuit 121 outputs the address signal to the decoder 103, and outputs the control signal to the power supply circuit 105.

The power supply circuit 105 contains a gate boosting circuit 151 and a drain boosting circuit 152. The gate boosting circuit 151 applies a word line voltage (gate voltage) corresponding to the control signal to the selection word line W through the decoder 103 in accordance with the control signal. The drain boosting circuit 152 supplies the write current to the write circuit 106.

In the nonvolatile semiconductor memory device, there is a case that in the write operation, the plurality of memory cells are selected and the write operation is performed on the selected memory cells at a same time. In such a case, the number of the memory cells to which the write operation can be performed at the same time is limited in accordance with a current drive performance of the power supply circuit (the drain boosting circuit 152 in case of FIG. 2). In particular, in the nonvolatile semiconductor memory device of the NOR type that uses the CHE, the write current flowing through the memory cell in the write operation is relatively greater than that of the nonvolatile semiconductor memory device that does not use the CHE. Thus, a limit is caused due to the current drive performance of the power supply circuit.

FIG. 3 is a diagram showing a write sequence of the conventional nonvolatile semiconductor memory device of the NOR type that uses the CHE and has the configuration shown in FIGS. 1 and 2. The vertical axis indicates voltage, and the horizontal axis indicates time. The line DC (solid line) shows change of voltage applied to the word line, namely, the control gate of the memory cell. FIG. 4 is a block diagram showing a part of the configuration of FIG. 2. FIGS. 5 and 6 are timing charts showing the write data shown in FIG. 4.

With reference to FIG. 4, when the data is written into the memory cells for 16 bits, data signals D0 to D15 are supplied to the detecting circuit 122 at the same time. The data signals D0 to D15 at that time are supplied between a time t01 and a time t02, as shown in FIG. 5. The detecting circuit 122 refers to the data signals D0 to D15 between the time t01 and the time t02 and detects the number of memory cells into which the write operations are performed at the same time is 16. Then, the detecting circuit 122 outputs a detection signal indicating 16 to the write control circuit 121 together with the data signals D0 to D15.

Because of the limit resulting from the current drive performance of the power supply circuit 105, the number of the memory cells into which the write operation can be performed at one time is set to 8. Thus, the write control circuit 121 divides the data signals D0 to D15 into the two parts. Then, the control is performed such that the write operations are performed on the data signals D0 to D7 and then the write operations are performed on the data signals D8 to D15.

Specifically, the write operations will be performed below. That is, between the time 02 (FIG. 5) and the time t11 (FIG. 3), the write control circuit 121 supplies the control signal to the power supply circuit 105 in order to perform the write operation on the data signals D0 to D7. At the time t11 (FIG. 3), the gate boosting circuit 151 of the power supply circuit 105 applies a gate voltage (write voltage) $V_{pg1}$ that is the positive voltage, e.g., 9 V, to the control gate of the selection cell through the decoder 103 by the selection word line Ws in accordance with the control signal.

Between the times t12' and t13' shown in FIG. 6 corresponding to the times t12 and t13 in FIG. 3, the write control circuit 121 supplies the data signals D0' to D7' shown in FIG. 6 corresponding to the data signals D0 to D7, to the write circuits 161-0 to 161-7. Thus, as shown in FIG. 4, in the write circuits 161-0 to 161-7 of the write circuits 161-0 to 161-15, to which the data signals D0' to D7' are supplied, their N channel transistors are turned on, and the drain boosting circuit 152 and the selection bit lines BL1 to BL7 are connected through the write circuits 161-0 to 161-7.

At the time t12 (FIG. 3), the drain boosting circuit 152 of the power supply circuit 105 applies a drain voltage $V_{DS0}$ that is the positive voltage of about (½)$V_{pg1}$, e.g., 5 V, to the drains of the selection memory cells through the write circuits 161-0 to 161-7, the column switch circuit 104 and the selection bit lines BL1 to BL7 in accordance with the control signal. At this time, source lines are grounded.

From those processes, between the times t12 and t13 (FIG. 3), the gate voltage $V_{pg1}$ becomes 9 V, and the drain voltage $V_{DS0}$ becomes 5 V. As mentioned above, the write operations are performed on the selection memory cells. Here, the data is written to the selection memory cells for 8 bits (the regions 102-0 to 102-7) at the same time.

After that, between the times t14 and t15 (FIG. 3), the memory device is shifted to a sequence of verification and it is checked whether or not then the memory cell hast a desirable threshold voltage, for the selection memory cells into which the data is written. If the memory cell does not have the desirable threshold voltage, the rewrite operation at the write voltage (gate voltage) $V_{pg1}$ and the verification operation are repeatedly performed on only the memory cell in which the write operation is not sill completed. FIG. 3 shows the example in which the rewrite operation is not performed.

Prior to the time t15 (FIG. 3), the write control circuit 121 supplies the control signal to the power supply circuit 105 in order to perform the write operation on the data signals D8 to D15. At the time t15 (FIG. 3), the gate boosting circuit 151 of the power supply circuit 105 applies the gate voltage (write voltage) $V_{pg1}$ that is the positive voltage, e.g., 9 V, to the control gates of the selection memory cells through the decoder 103 and the selection word line W in accordance with the control signal.

Between the times t16' and t17' shown in FIG. 6 corresponding to a period between the times t16 and t17 shown in FIG. 3, the write control circuit 121 supplies the data signals D8' to D15' corresponding to the data signals D8 to D15 to the write circuits 161-8 to 161-15, as shown in FIG. 6. Thus, as shown in FIG. 4, in the write circuits 161-8 to 161-15 among the write circuits 161-0 to 161-15 to which the data signals D8' to D15' are supplied, their N channel transistors are turned on, and the drain boosting circuit 152 and the selection bit lines BLi connected to the write circuits 161-8 to 161-15 are connected. At the time t16 (FIG. 3), the drain boosting circuit 152 of the power supply circuit 105 applies the drain voltage $V_{DS0}$ that is the positive voltage of about (½) $V_{pg1}$, e.g., 5 V to the drains of the selection memory cells through the write circuits 161-8 and 161-15 and the column switch circuit 104 and the selection bit lines BLi in accordance with the control signal. The source line is grounded.

From those processes, between the times t16 and t17 (FIG. 3), the gate voltage $V_{pg1}$ becomes 9 V, and the drain voltage $V_{DS0}$ becomes 5 V. As mentioned above, the write operations are performed on the selection memory cells. Here, the data is written to the memory cells for 8 bits (the regions 102-8 to 102-15) at the same time.

After that, between the times t18 and t19 (FIG. 3), the operation is shifted to the sequence of the verification and then whether or not the memory cell has the desired threshold voltage is checked for the selection memory cells into which the data is written. If the memory cell does not have the desirable threshold voltage, the rewrite operation at the write voltage (gate voltage) $V_{pg1}$ and verification are repeatedly performed on only the memory cell where the write operation is not sill completed. In this way, the data corresponding to the 16 bits (the regions 102-0 to 102-15) are written at the times between t11 and t19.

In conjunction with the above description, Japanese Laid Open Patent Application (JP-P2001-52486A) discloses a flash memory device and a method of programming the same. In this conventional programming method, the flash memory device having an array of memory cells in a matrix is programmed. In this programming method, at least two memory cells among the memory cells are selected. Each of the selected memory cells is sequentially programmed to a predetermined threshold voltage lower than a target threshold voltage in a first time. The selected memory cells at the same time are programmed from the predetermined threshold voltage to the target threshold voltage in a second time. The flash memory device may be of the NOR type. The different drain voltages may be supplied to each of the columns corresponding to each of the selected memory cells in the second stage and the third stage.

Also, Japanese Laid Open Patent Application (JP-P2005-235287A) discloses a method of programming a nonvolatile semiconductor memory device, a programming apparatus, and a nonvolatile semiconductor memory device. In the method of programming the nonvolatile semiconductor memory device, applying a write pulse to a control gate of the memory element that has the control gate and a floating gate programs a memory element. That is, the write pulse is applied to the memory element while gradually increasing the write performance of the write pulse, until the threshold of the memory element becomes equal to or more than a first reference voltage. The write pulse has the write performance equal to or lower than the write performance of the write pulse finally applied at the above stage, until the threshold becomes equal to or more than a second reference voltage, and is applied to the memory element having a threshold that is higher than the first reference voltage and lower than the second reference voltage, after the above stage.

Also Japanese Laid Open Patent Application (JP-P2003-123491A) discloses a nonvolatile semiconductor memory device and a method of programming the same. This conventional nonvolatile semiconductor memory device includes a bit line, a first selection line, a first selection transistor, a word line, a nonvolatile memory cell transistor, a second selection line, a second selection transistor, a high voltage pump circuit, a selection line driver, a word line decoder and a slope control circuit. The first selection transistor has a control electrode connected to the first selection line and a current path whole one end is connected to the bit line. The word line is arranged adjacent to the first selection line and along with the first selection line. The nonvolatile memory cell transistor has a control electrode connected to the word line and a current path whose one end is connected to the other end of the current path of the first selection transistor. The second selection transistor has the control electrode connected to the second selection line and a current path whose one end is connected to the other end of the current path of the nonvolatile memory cell transistor and whose other end is connected to a ground voltage. The high voltage pump circuit generates a high voltage higher than a power supply voltage during a programming operation of the nonvolatile memory cell transistor. The selection line driver supplies a selection voltage to the first selection line during a period while the program voltage is supplied to the word line, and the selection voltage is limited to be lower than the power supply voltage. The high voltage and the selection voltage are supplied to the word line decoder, which supplies the program voltage to the word line. The slope control circuit controls a rising slope of the program voltage. The slope control circuit increases the program voltage during a predetermined period enough to protect the electrostatic coupling between the first selection line and the word line.

In the write sequence of the conventional nonvolatile semiconductor memory device of the NOR type that uses the CHE shown in FIG. 3, the data are preferably written to the memory cells for 16 bits at the same time. However, in case of using the CHE, the value of the write current flowing through the memory cell in the write sequence is relatively large. Thus, as shown in FIG. 3, the write operation is performed for each memory cells for 8 bits. That is, since the power supply circuit cannot supply the write current exceeding the current driver performance, this copes with it by limiting the number of the memory cells to which the write operations are performed at the same time, and then switching the memory cells of the write target in the write sequence. Therefore, the number of times of the write operation is increased, which results in a longer write time. A technique for shortening the write time is demanded. As a method of shortening the write time, a technique for increasing the power supply circuit and reducing the number of times of the write operation may be considered. However, this technique leads to a large circuit area of the power supply circuit and increases a chip area.

In Japanese Laid Open Patent Application (JP-P2001-52486A) is disclosed a technique for decreasing a circuit area of a power supply circuit. However, this technique has the following problems. FIG. 7 is a graph explaining the principle of the programming method in Japanese Laid Open Patent Application (JP-P2001-52486A). The vertical axis indicates a write current $I_{pg}$ (a source—drain current), and the horizontal axis indicates a source—drain voltage $V_{DS}$ (hereinafter, to be referred to as [Drain Voltage $V_{DS}$]). The memory cell can be regarded as a usual MOS transistor when viewed from a floating gate. Thus, the memory cell exhibits the standard drain current characteristic (the $I_d$-$V_{DS}$ characteristic: corresponding to the $I_{pg}$-$V_{DS}$ in FIG. 2) as the MOS transistor shown in FIG. 2.

With reference to FIG. 7, the programming method in Japanese Laid Open Patent Application (JP-P2001-52486A) gives a sufficiently high gate voltage $V_G$ and controls the value of the drain voltage $V_{DS}$ and consequently obtains the desirable write current $I_{pg}$ (for example, $I_{prc}$). That is, the operation is not performed in a saturation region A2 where independently of the value of the drain voltage $V_{DS}$, the write current $I_{pg}$ becomes substantially constant ($I_{pr}$), and it is performed in a transition region A1 where the write current $I_{pg}$ can be controlled in the drain voltage $V_{DS}$. At this time, for example, when the operation is performed under a drain voltage $V_{DSC}$ in FIG. 7, the write current is $I_{prc}$ (<$I_{pr}$). However, in one memory cell array, it is not always possible to generate the same drain voltage $V_{DSC}$ for all of the memory cells. Thus, an error $V_{DS}$ of the voltage may be considered to be generated because of the relation of a manufacture yield. The error $V_{DS}$ directly causes the generation of a large error $I_{prc}$ of the write current $I_{pg}$. That is, the error $V_{DS}$ of the drain voltage $V_{DSC}$ causes the write variation. A technique that can stably reduce the write time while suppressing the increase in the chip area is desired.

SUMMARY OF THE INVENTION

In an aspect of the present invention, a nonvolatile semiconductor memory device includes a memory cell array configured to have a plurality of nonvolatile memory cells arranged in a matrix; a selecting section configured to select as selection memory cells, at least two of the plurality of nonvolatile memory cells from the memory cell array; and a write section configured to apply to the selection memory cells, a gate voltage which increases step by step, until a threshold voltage of each of the selection memory cells reaches a target threshold voltage, such that the threshold voltage increases step-by-step.

Here, the write section may write the target threshold voltage into the selection memory cell in n (n is a natural number larger than 1) steps.

In this case, the write section may write the target threshold voltage into the selection memory cell in the n steps without performing a verification between two of the n steps.

Also, the gate voltage may be applied such that a write current for one step is about 1/n of write current when the target threshold voltage is written into the selection memory cell in one time.

Also, the write section may write a first threshold voltage into the selection memory cell by applying a first gate voltage to the selection memory cell, and then write the target threshold voltage into the selection memory cell by applying a second gate voltage larger than the first gate voltage to the selection memory cell.

In this case, the write of the first threshold voltage and the write of the target threshold voltage may be performed without performing a verification between the write of the first threshold voltage and the write of the target threshold voltage.

Also, the write section may apply the first gate voltage such that a write current flowing through the selection memory cell when the first threshold voltage is written in the selection memory cell is a half of a write current flowing through the selection memory cell when the target threshold voltage is written in the selection memory cell in one time.

Also, when the write into the selection memory cell is not completed right as a result of a verification to the selection memory cell, the write section may set the gate voltage to be higher than the gate voltage in the write immediately before the verification and write the target threshold voltage in the selection memory cell.

Also, when the write into the selection memory cell is not completed right as a result of a verification to the selection memory cell, the write section may set at least one of the gate voltage and a drain voltage to be higher than a voltage in the write immediately before the verification and write the target threshold voltage in the selection memory cell.

In another aspect of the present invention, a method of writing data in a nonvolatile semiconductor memory device, is achieved by selecting as selection memory cells, at least two of a plurality of nonvolatile memory cells arranged in a matrix from a memory cell array; and by writing a target threshold voltage into each of the selection memory cells by increasing a threshold voltage of the selection memory cell step-by-step while applying a gate voltage increasing step by step to the selection memory cell.

Here, the writing may be achieved by writing the target threshold voltage into the selection memory cell in n (n is a natural number larger than 1) steps.

In this case, the writing may be achieved by writing the target threshold voltage into the selection memory cell in the n steps without performing a verification between two of the n steps.

Also, the writing may be achieved by applying the gate voltage to the selection memory cell such that a write current for one step is about 1/n of write current when the target threshold voltage is written into the selection memory cell in one time.

Also, the writing may be achieved by writing a first threshold voltage into the selection memory cell by applying a first gate voltage to the selection memory cell; and by writing the target threshold voltage into the selection memory cell by applying a second gate voltage larger than the first gate voltage to the selection memory cell.

In this case, the writing a first threshold voltage and the writing the target threshold voltage are preferably performed without performing a verification between the writing a first threshold voltage and the writing the target threshold voltage.

Also, the writing may be achieved by writing the first gate voltage in the selection memory cell such that a write current flowing through the selection memory cell when the first threshold voltage is written in the selection memory cell is a half of a write current flowing through the selection memory cell when the target threshold voltage is written in the selection memory cell in one time.

Also, the method may be achieved by further performing a verification to the selection memory cell after the writing; when the writing is not completed correctly as a result of the verification, setting the gate voltage to be higher than the gate voltage in the writing immediately before the verification; and re-writing the target threshold voltage in the selection memory cell based on the set gate voltage.

Also, the method may be achieved by further performing a verification to the selection memory cell after the writing; when the writing is not completed correctly as a result of the verification, setting at least one of the gate voltage and a drain voltage to be higher than the voltage in the writing immediately before the verification; and re-writing the target threshold voltage in the selection memory cell based on the set voltage.

In another aspect of the present invention, a method of writing data into a plurality of memory cells of a nonvolatile semiconductor memory device at a same time, is achieved by selecting at least one of the plurality of memory cells; by setting a gate voltage of the selected memory cell to a first voltage level; by writing a first threshold voltage into the selected memory cell by using the gate voltage of the first voltage level; by changing the gate voltage of the selected memory cell from the first voltage level into a second voltage level; by writing a second threshold voltage higher than the first threshold voltage into the selected memory cell by using the gate voltage of the second voltage level; and by determining a write state into the selected memory cell.

Here, the method may be achieved by further changing the gate voltage of the selected memory cell from the second voltage level into a third voltage level, when the write state is determined to be insufficient; and writing the second threshold voltage into the selected memory cell by using the gate voltage of the third voltage level.

In another aspect of the present invention, a method of writing data into a nonvolatile semiconductor memory device, is achieved by selecting a plurality of memory cells from the semiconductor memory device for a write data; and by writing the write data into the plurality of memory cells while selectively increasing a threshold voltage of each of the plurality of memory cells over a plural number of times based on the write data.

According to the present invention, it is possible to suppress increase in a chip area and perform data write operation in parallel to memory cells and further reduce the write time.

DESCRIPTION OF THE PREFERRED EMBODIMENTS

Hereinafter, a nonvolatile semiconductor memory device of the present invention and a method of writing data into the nonvolatile semiconductor memory device will be described in detail with reference to the attached drawings.

Figure 1:
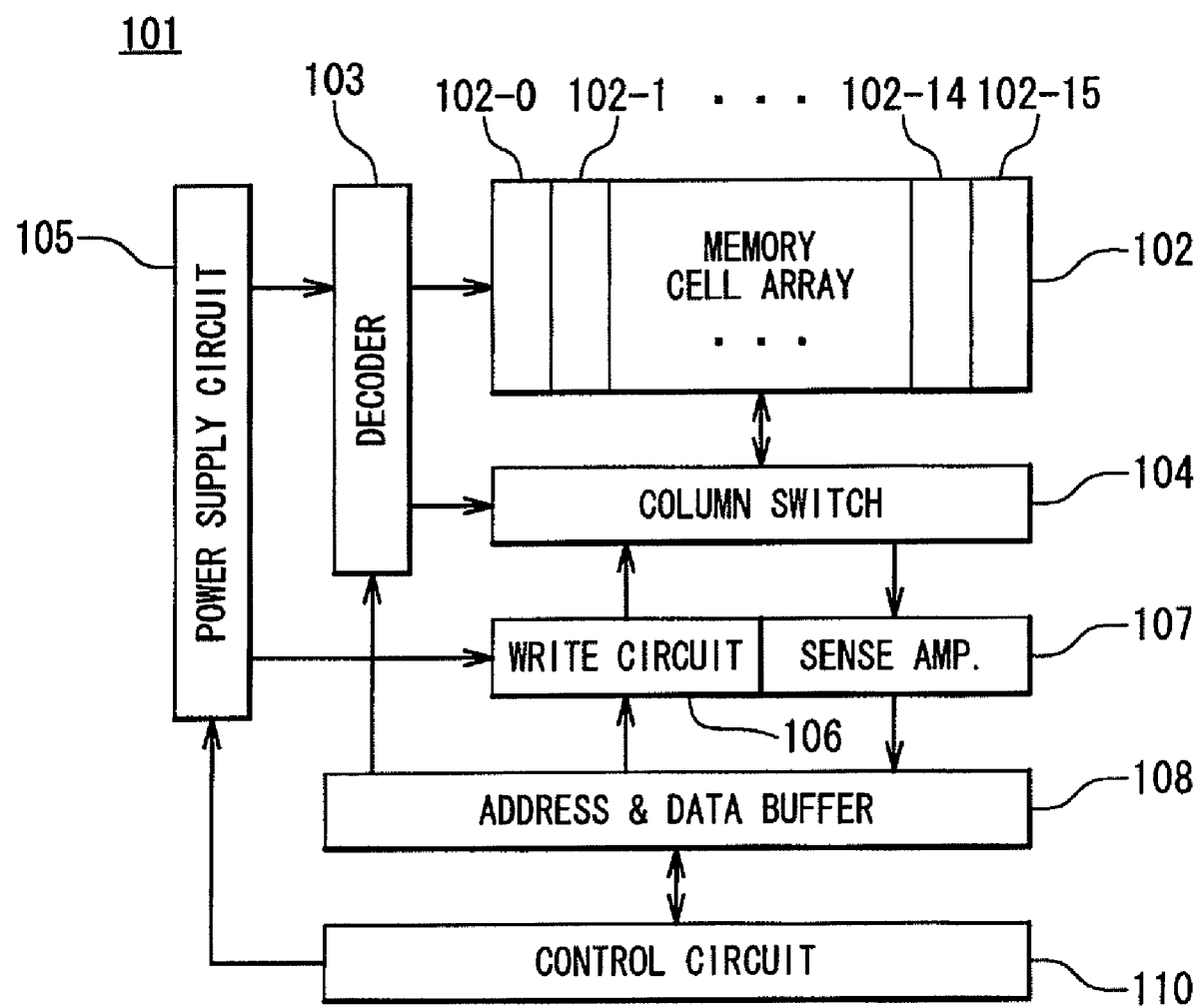
FIG. 1 is a block diagram showing a configuration of a conventional nonvolatile semiconductor memory device.
Figure 2:
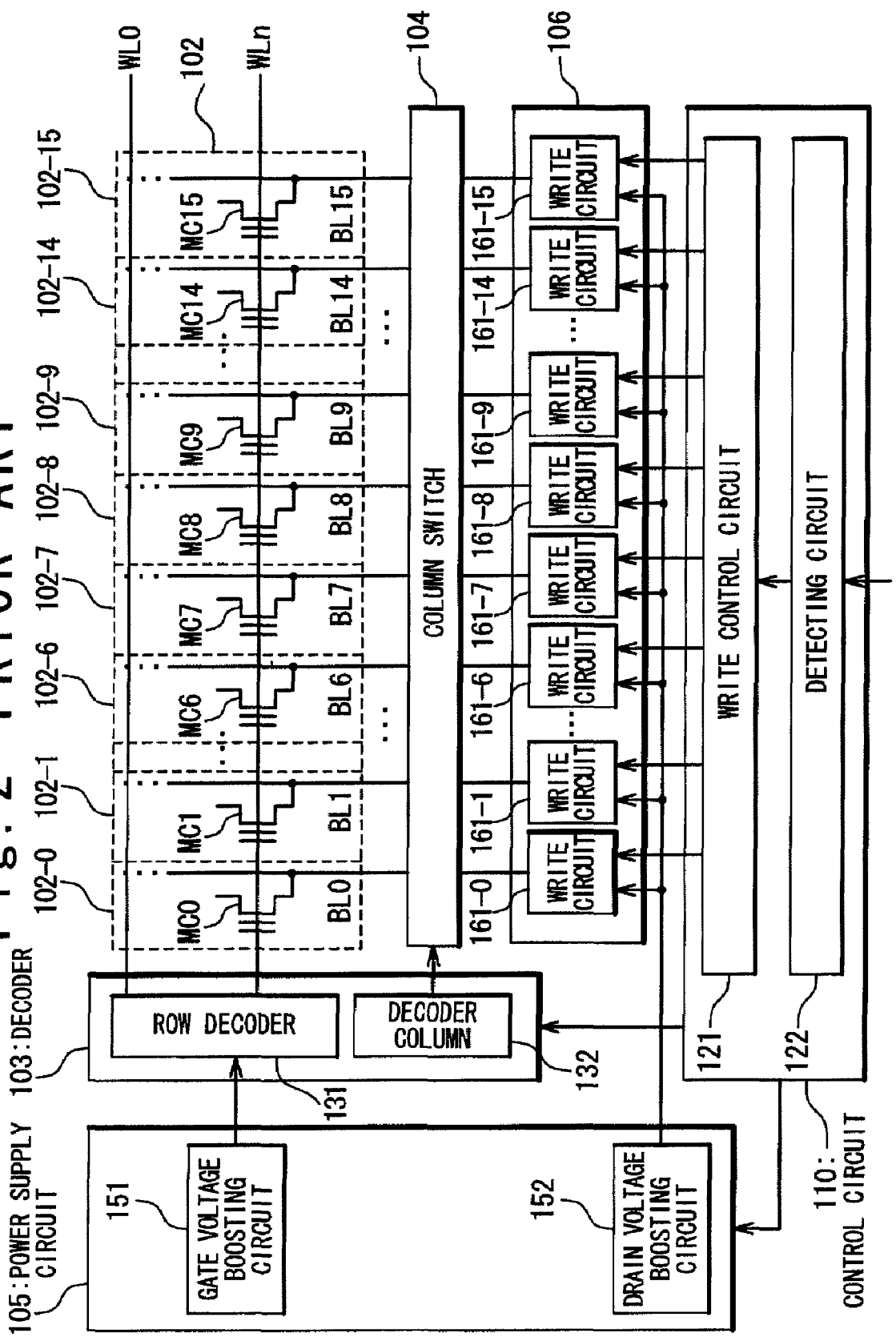
FIG. 2 is a block diagram showing a detailed configuration of the conventional nonvolatile semiconductor memory device.
Figure 3:
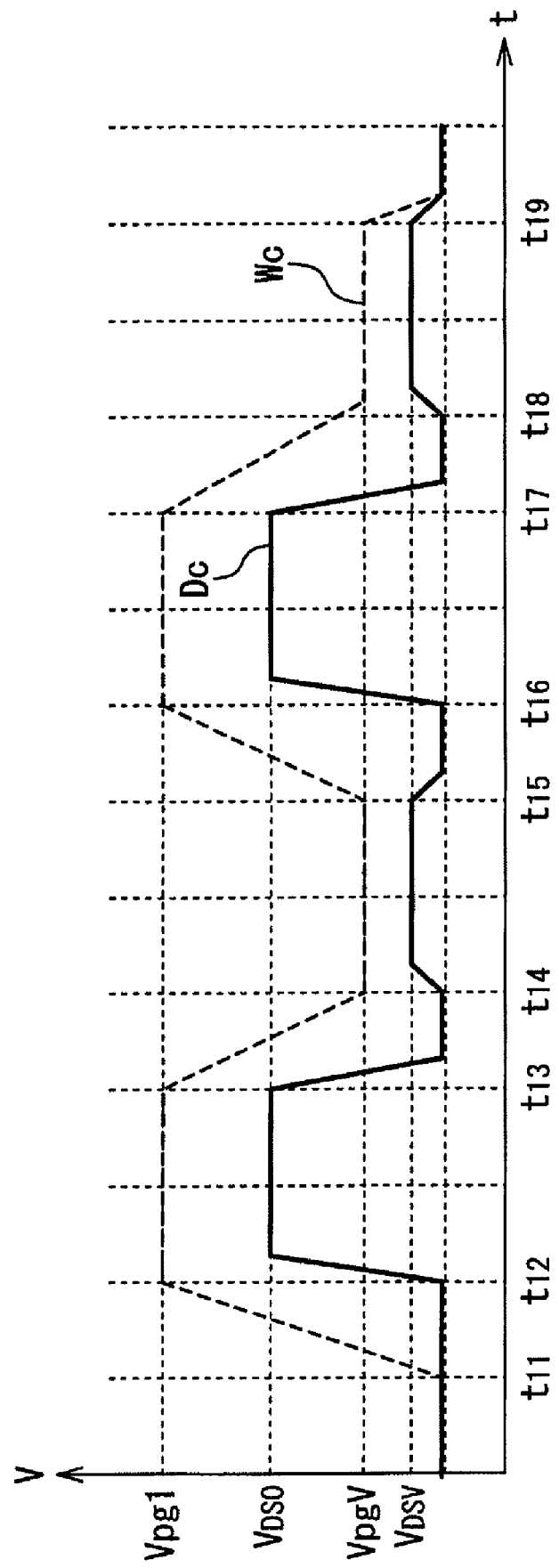
FIG. 3 is a diagram showing a write sequence of the conventional nonvolatile semiconductor memory device of a NOR type.
Figure 4:
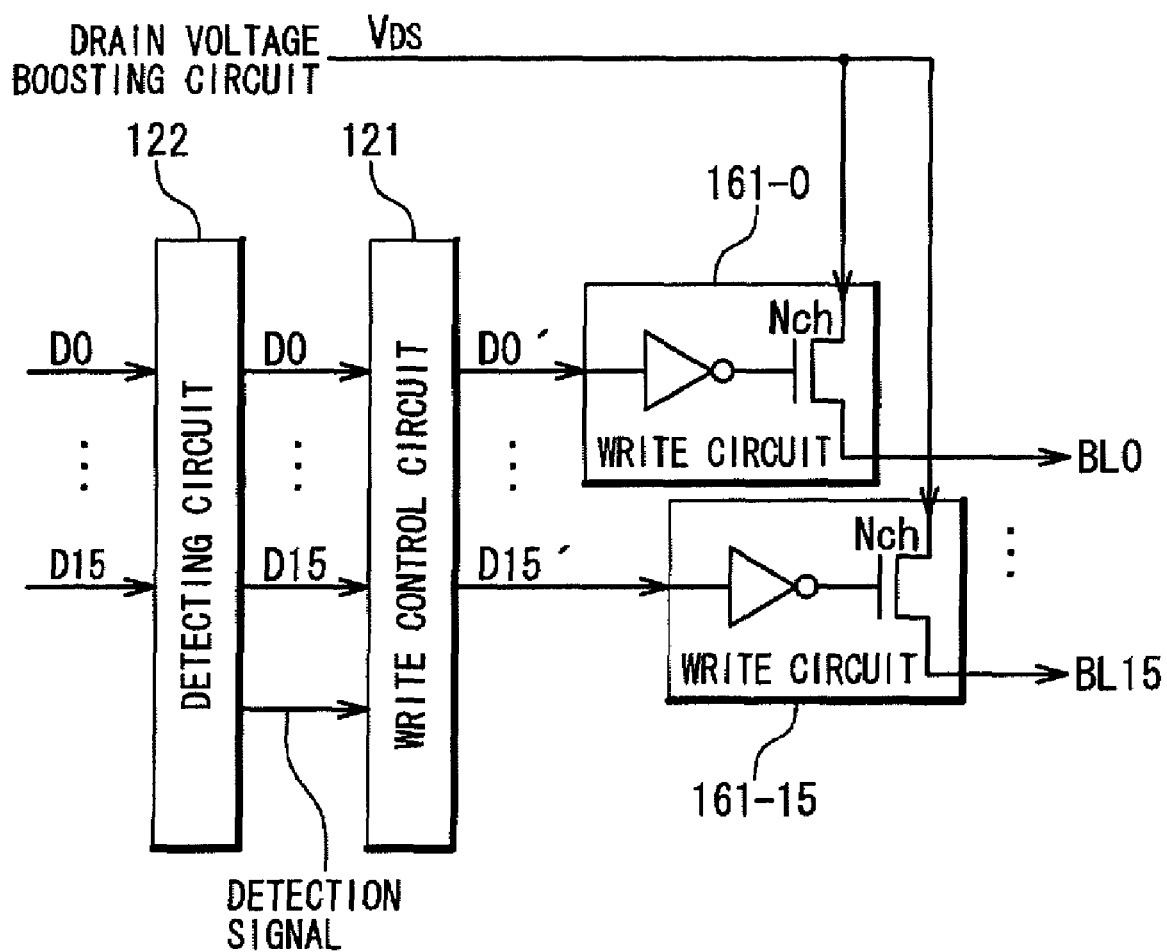
FIG. 4 is a block diagram showing a part of the configuration of FIG. 2.
Figure 5:
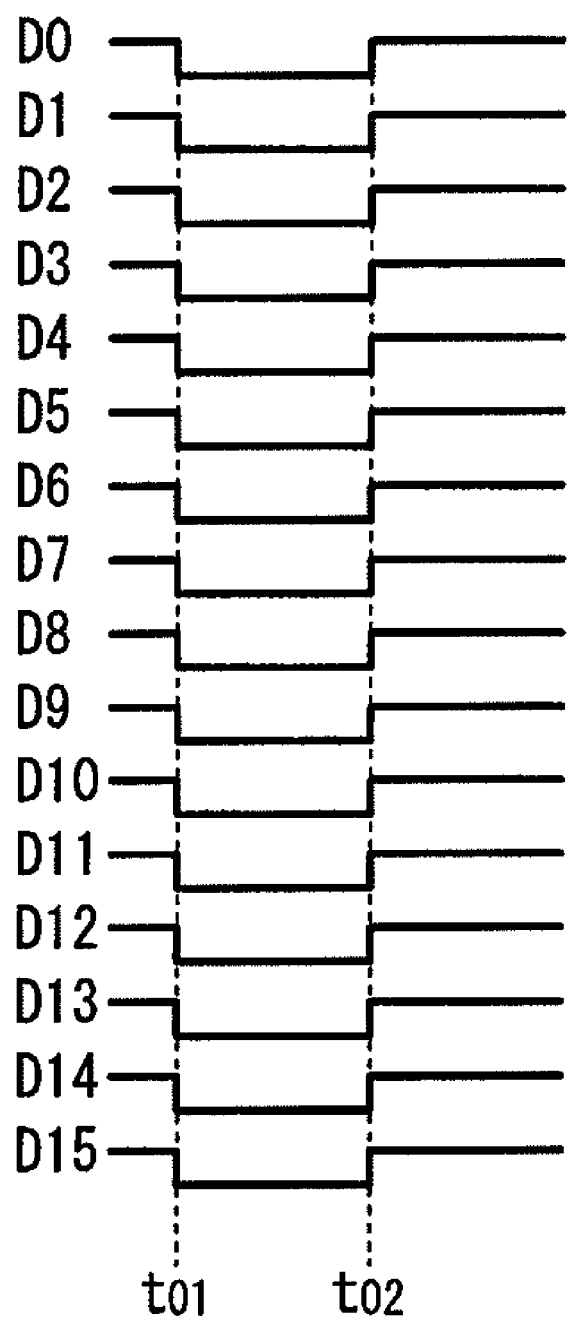
FIG. 5 shows timing charts of a write data shown in FIG. 4.
Figure 6:
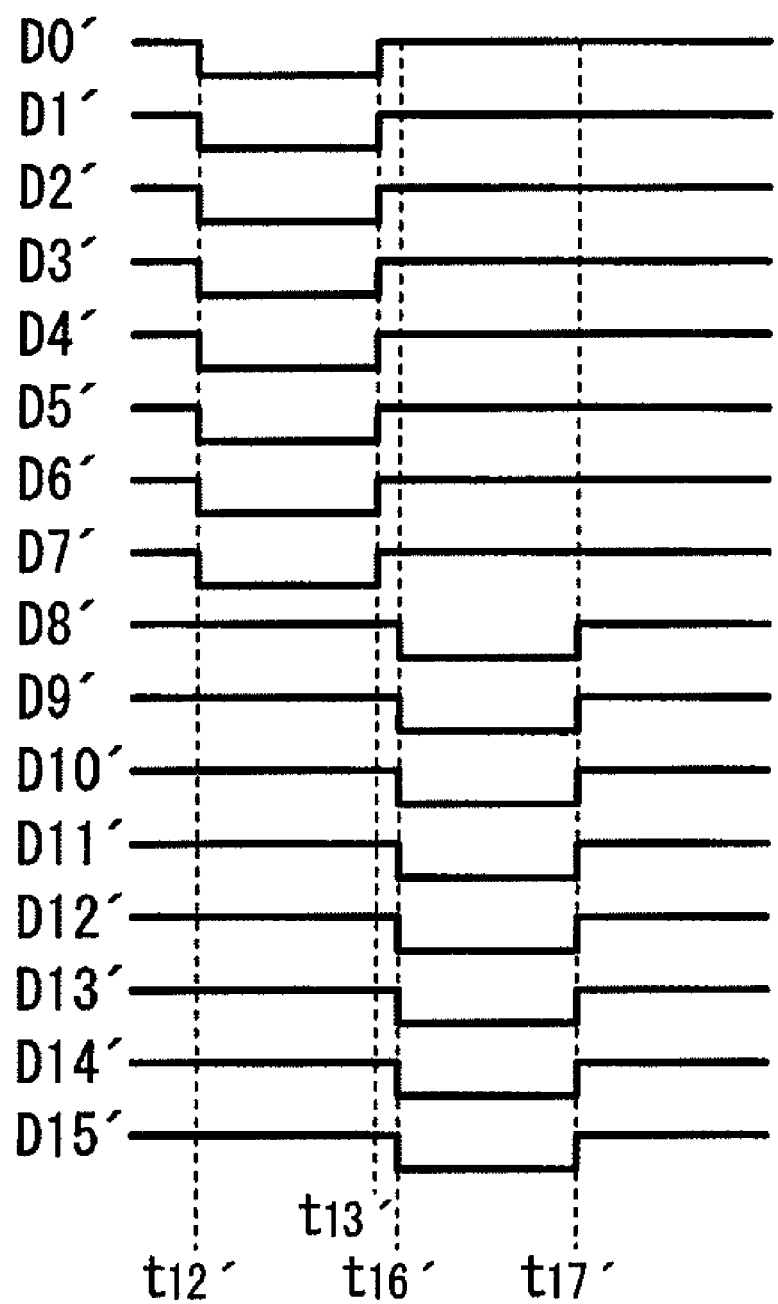
FIG. 6 shows timing charts showing the write data shown in FIG. 4.
Figure 7:
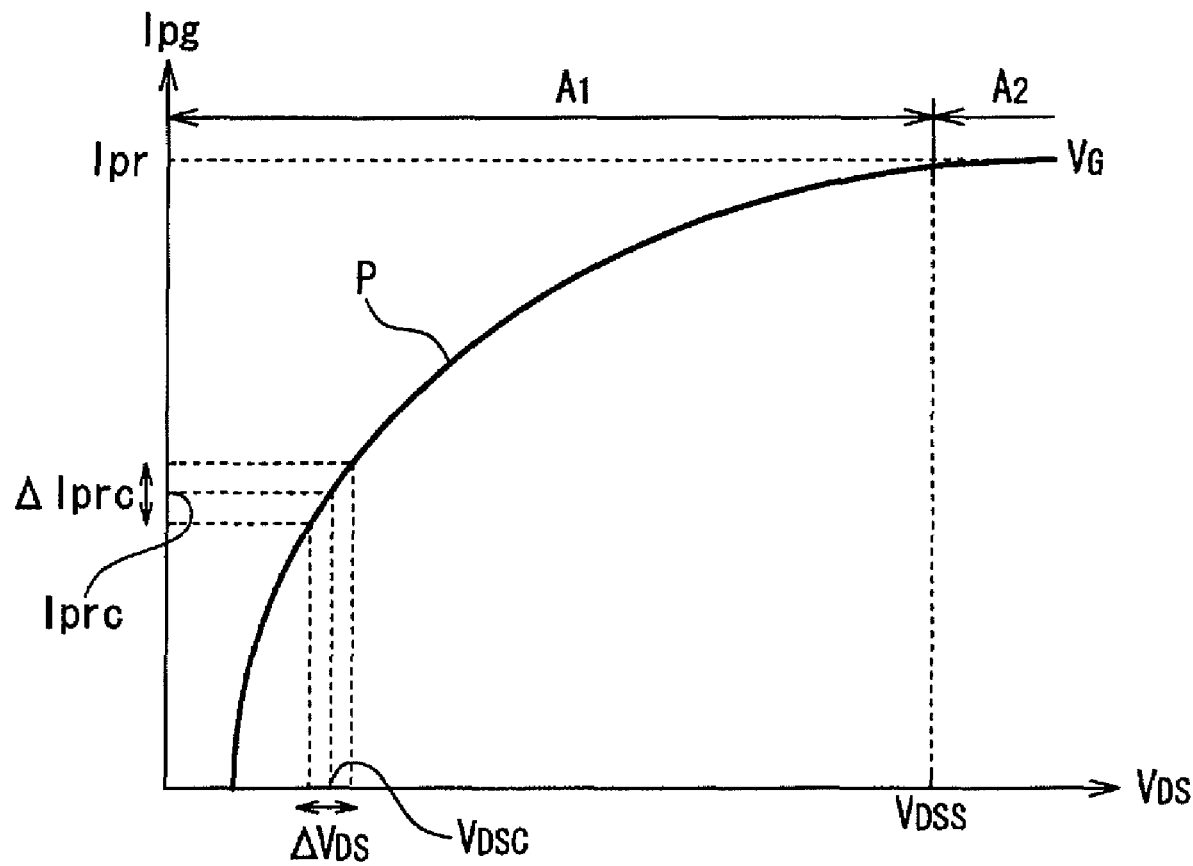
FIG. 7 is a graph showing the principle of a programming method in a conventional nonvolatile semiconductor memory device.
Figure 8:
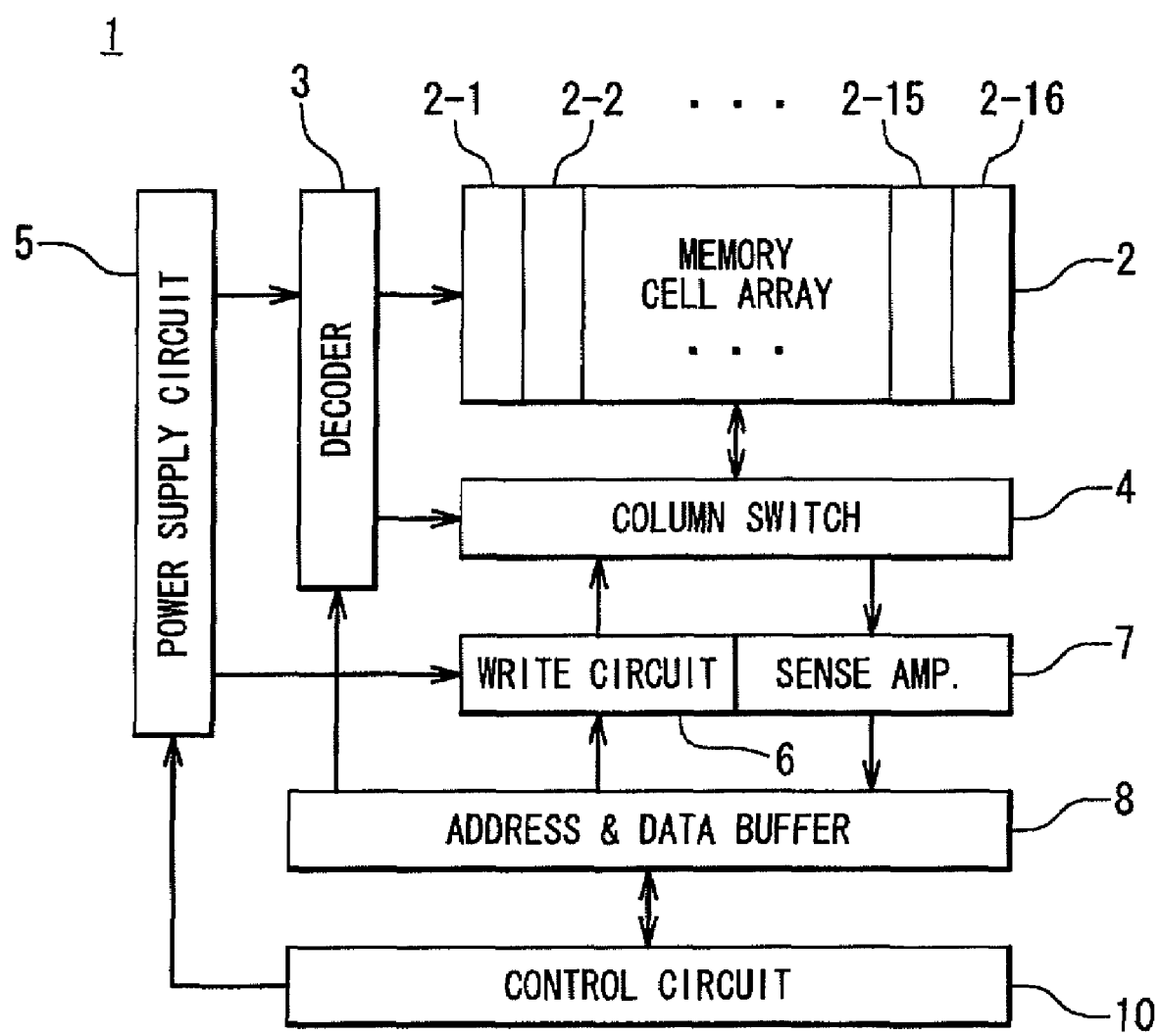
FIG. 8 is a block diagram showing a configuration of a nonvolatile semiconductor memory device according to an embodiment of the present invention.

FIG. 8 is a block diagram showing the configuration of the nonvolatile semiconductor memory device according to an embodiment of the present invention. The nonvolatile semiconductor memory device 1 contains a memory cell array 2, a decoder 3, a column switch circuit 4, a power supply circuit 5, a write circuit 6, a sense amplifier circuit 7, an address & data buffer 8 and a control circuit 10.

The memory cell array 2 contains a plurality of memory cells (not shown), a plurality of bit lines (not shown), and a plurality of source lines (not shown). The plurality of word lines extend in a first direction (for example, an X-direction), and their one ends are connected to the decoder 3. The plurality of bit lines extend in a second direction (for example, a Y-direction) and their one ends are connected to the column switch circuit 4. The plurality of source lines extend in the first direction and are grounded. The plurality of memory cells are arranged in a matrix at each of the intersections between the plurality of bit lines and the plurality of word lines. Each of the memory cells (M) is the flash memory cell that uses CHE (Channel Hot Electron). The plurality of memory cells, the plurality of bit lines, the plurality of word lines and the plurality of source lines are connected in the NOR type.

The memory cell array 2 is divided into a plurality of regions 2 (2-1 to 2-16), for example, in accordance with the number of bits (for example, 16 bits) of a data. Thus, in a write sequence, since one data is written for each region 2 at the same time, the data of 16 bits can be written at the same time.

The decoder 3 selects as a selection word line, one from among the plurality of word lines in the memory cell array 2 in accordance with an address signal from the address data buffer 8. Also, the decoder 3 outputs a column address signal to the column switch circuit 4. The column switch circuit 4 selects as a selection bit line, one from among the plurality of bit lines in each of the plurality of regions 2-1 to 2-16 in accordance with the column address signal. That is, in an example of FIG. 8, a total of 16 selection bit lines is selected at the same time. The decoder 3 and the column switch circuit 4 select a plurality of selection memory cells from the plurality of memory cells by the selection word line and the plurality of selection bit lines. That is, these circuits can be regarded as a selection section for selecting at least two selection memory cells from the memory cell array 2.

The power supply circuit 5 applies a word line voltage having a plurality of voltage levels determined in accordance with a control signal from the control circuit 10 to the selection word line selected by the decoder 3. The word line voltage corresponds to a gate voltage. Also, the power supply circuit 5 has a function of a charge pump for supplying a current to the write circuit 6. The write circuit 6 supplies a current supplied from the power supply circuit 5, as a write current, to each of the plurality of selection bit lines selected by the column switch circuit 4 at the same time in accordance with the data supplied from the address & data buffer 8. Thus, a data signal is written to each of the 16 selection memory cells at one time.

The gate voltage is supplied to each of the gates of the plurality of selection memory cells through the selection word line and the write current is supplied to each of the drains of the plurality of selection memory cells through the plurality of selection bit lines. Thus, the power supply circuit 5 and the write circuit 6 can be regarded as a write section for writing a predetermined threshold voltage to each of the plurality of selection memory cells.

The sense amplifier circuit 7 detects that the write state or the threshold voltage of the selection memory cell is at a desirable level, and outputs the detection result to the address & data buffer 8. The address & data buffer 8 transiently stores the address signal of the memory cells into which the write operation is performed, from the control circuit 10, the write data, and the detection result of the sense amplifier circuit from the address & data buffer 8. Then, the sense amplifier circuit 7 outputs the address signal to the decoder 3, the write data to the write circuit 6, and the detection result of the sense amplifier circuit to the control circuit 10.

The control circuit 10 outputs the address signal of the memory cells into which the write operation is performed and the write data to the address & data buffer 8, and outputs the control signal to the power supply circuit 5. Also, the control circuit 10 receives the detection result of the sense amplifier circuit from the address & data buffer 8.

Figure 9:
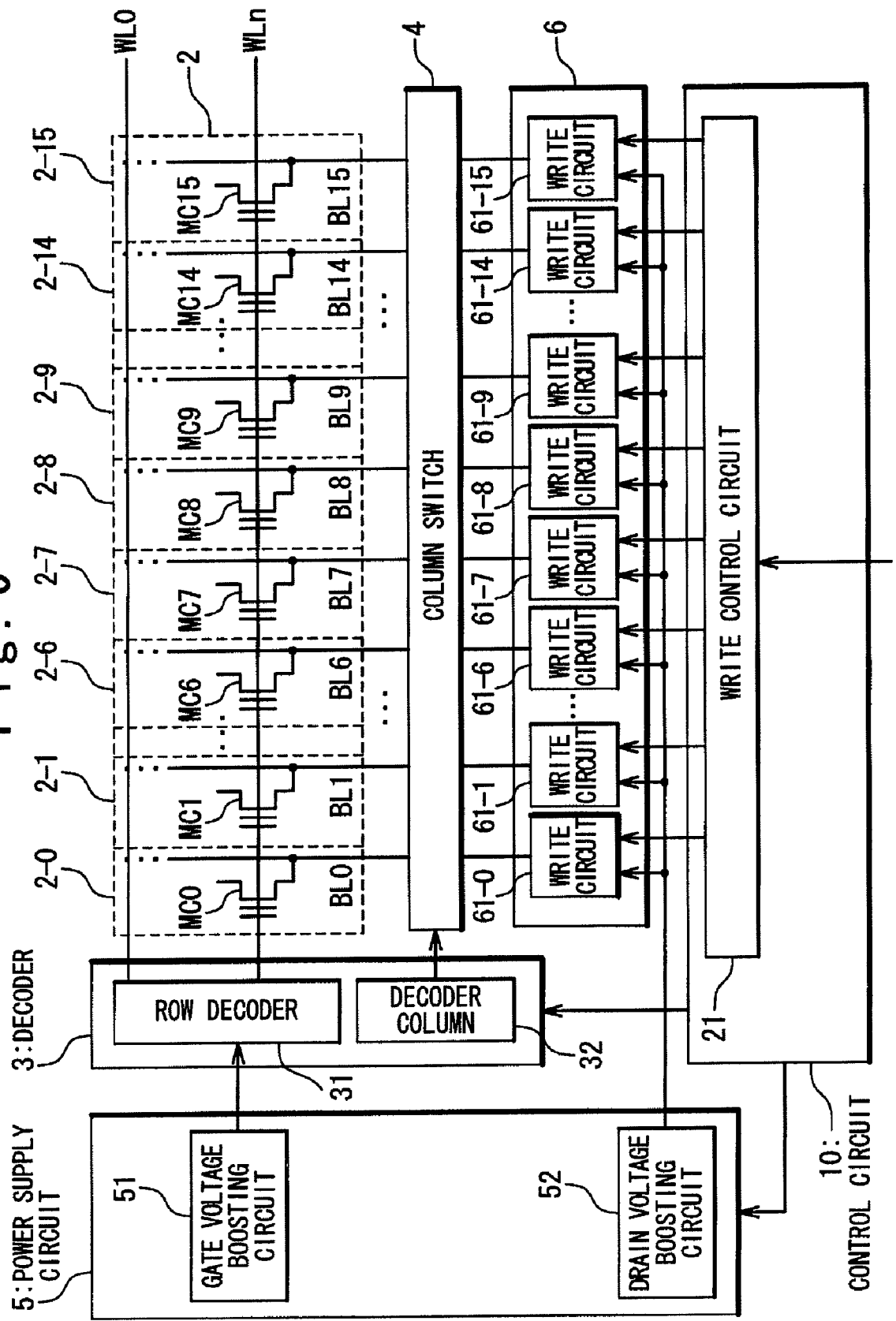
FIG. 9 is a block diagram showing the detailed configuration of the nonvolatile semiconductor memory device according to the embodiment of the present invention.

FIG. 9 is a block diagram showing the detailed configuration of the nonvolatile semiconductor memory device according to the embodiment of the present invention. It should be noted that in FIG. 9, the sense amplifier circuit 7 and the address & data buffer 8 are omitted.

The memory cell array 2 is of an NOR type shown in FIG. 9. Each region 2-$i$ ($i$=an integer of 0 to 15, and hereinafter, it is similar) contains a plurality of word lines WL, a plurality of source lines SL, a plurality of bit lines BL, and a plurality of memory cells MC. The plurality of memory cells MC are flash memory cells of the CHE type and arrayed in a matrix. The word line WL is common to the regions 2-$i$, and extends in the first direction (for example, an X-direction) and connected to control gates of the memory cells MC. The source line SL extends in the first direction (for example, the X-direction) and connected to sources of the memory cells MC. The bit line BL is connected to the second direction (for example, a Y-direction) substantially orthogonal to the first direction and connected to drains of the memory cells MC. The memory cells MC are provided at intersections of the word lines WL and the bit lines BL. The selection memory cell is selected from the plurality of memory cells MC by the selection word line and the selection bit line.

The decoder 3 contains the row decoder 31 and a column decoder 32. The row decoder 31 selects as the selection word line W, one from the plurality of word lines W0 to Wn in accordance with the address signal from the control circuit 10. The column decoder 32 decodes the address signal from the control circuit 10 to supply to the column switch circuit 4. The column switch circuit 4 selects as the selection bit line BLi, one from the plurality of bit lines BLi in accordance with the decoded address signal for each region 2-$i$ ($i$=an integer of 0 to 15, and hereinafter, it is similar).

The write circuit 6 contains a plurality of write circuits 61-0 to 61-15. Each write circuit 61-$i$ is used for the region 2-$i$ and connected to the selection bit line BLi of the corresponding region 2-$i$ through the column switch circuit 4. Each write circuit 61-*i* supplies the write current to the selection bit line BLi in accordance with the write data.

The control circuit 10 contains a write control circuit 21. The write control circuit 21 controls the operations of the plurality of write circuits 61-0 to 61-15 in accordance with the address signal of the memory cell of a write destination and the write data. Also, the control circuit 10 outputs the address signal to the decoder 3 and outputs the control signal to the power supply circuit 5, respectively.

The power supply circuit 5 contains a gate boosting circuit 51 and a drain boosting circuit 52. The gate boosting circuit 51 applies a word line voltage or the gate voltage corresponding to the control signal to the selection word line W through the decoder 3 in accordance with the control signal. The drain boosting circuit 52 supplies the write current to the write circuit 6.

Figure 13:
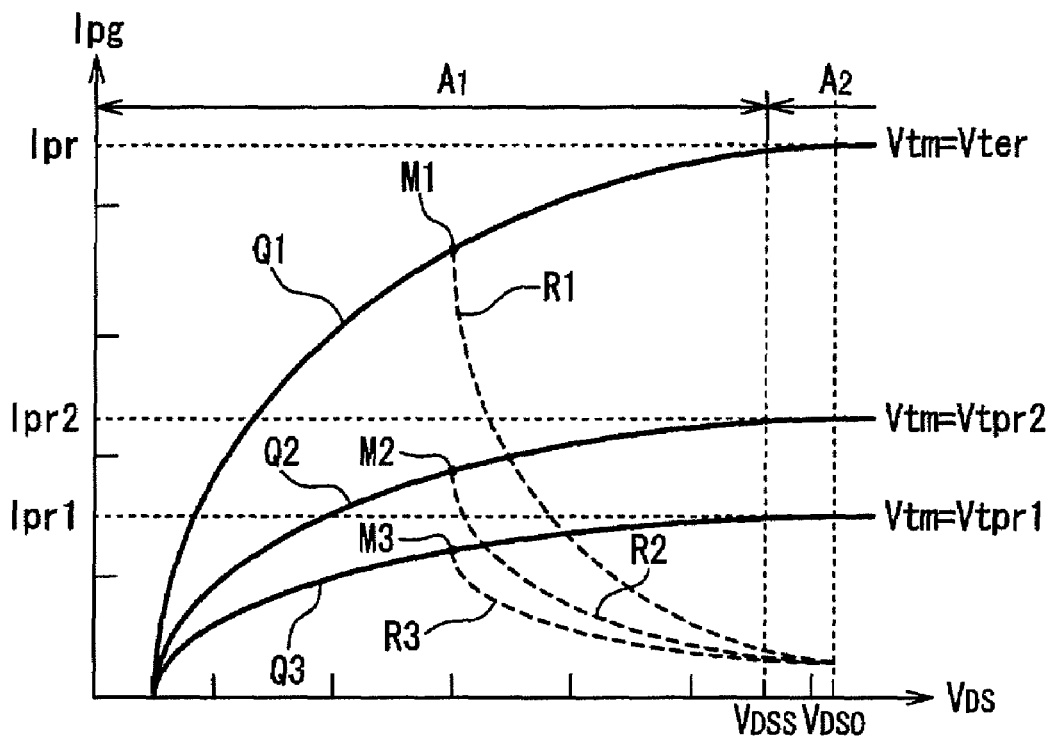
FIG. 13 is a graph sowing the principle of a write operation of the nonvolatile semiconductor memory device according to the embodiment of the present invention.

The write operation of the nonvolatile semiconductor memory device according to the embodiment of the present invention will be described below. FIG. 13 is a graph sowing the principle of the write operation of the nonvolatile semiconductor memory device according to the embodiment of the present invention. The vertical axis indicates a write current $I_{pg}$ (a source-drain current), and the horizontal axis indicates a drain voltage $V_{DS}$ (a source-drain voltage $V_{DS}$). The memory cell can be regarded as a usual MOS transistor when it is viewed from a floating gate. Thus, the memory cell exhibits a standard drain current characteristic (the $I_d$-$V_{DS}$ characteristic, corresponding to the $I_{pg}$-$V_{DS}$ characteristic shown in FIG. 13) as the MOS transistor shown by the solid line in FIG. 13.

The drain current characteristic (the $I_{pg}$-$V_{DS}$ characteristic) as the MOS transistor will be described below. Curves Q1 to Q3 (solid lines) indicate a case that a same gate voltage $V_G$ is applied to the control gate of the memory cell. However, the curve Q1 indicates the $I_{pg}$-$V_{DS}$ characteristic of a threshold voltage $V_{tm}$=$V_{ter}$ (the threshold voltage when the data is erased) of the memory cell. As the MOS transistor, a gate voltage V1=($V_G$-$V_{ter}$) can be substantially regarded to be applied. The curve Q2 indicates the $I_{pg}$-$V_{DS}$ characteristic of a threshold voltage $V_{tm}$=$V_{tpr2}$ (the threshold voltage at the middle stage between the threshold voltage when the data is erased and the threshold voltage of a write target) of the memory cell. As the MOS transistor, a gate voltage V2=($V_G$-$V_{tpr2}$) can be substantially regarded to be applied. The curve Q3 indicates the $I_{pg}$-$V_{DS}$ characteristic of the threshold voltage $V_{tm}$=$V_{tpr1}$ (the threshold voltage of the write target) of the memory cell. As the MOS transistor, a gate voltage V3=($V_G$-$V_{tpr1}$) can be substantially regarded to be applied. Here, since $V_{ter}$<$V_{ter2}$<$V_{tpr1}$, $V_1$>$V_2$>$V_3$.

In the curves Q1 to Q3 (the solid lines), a region where the drain voltage $V_{DS}$ is $V_{DSS}$ or lower is a transition region A1 where the write current $I_{pg}$ is increased with the increase in the drain voltage $V_{DS}$. A region where the drain voltage $V_{DS}$ is $V_{DSS}$ or more is a saturation region A2 where, even if the drain voltage $V_{DS}$ is increased, the write current $I_{pg}$ becomes approximately constant.

In the present invention, a drain voltage $V_{DS0}$ of the saturation region A2 is used at the time of the write operation. Thus, even if a small error is caused in the drain voltage $V_{DS0}$ due to a manufacture yield and the like, the substantially constant write current $I_{pg}$ can be sent in accordance with the gate voltage $V_G$. Also, it is known that even if the same gate voltage $V_G$ is given, the write current $I_{pg}$ is suppressed ($I_{pr}$, $I_{pr2}$, $I_{pr1}$) as the threshold voltage $V_{tm}$ of the memory cell becomes higher ($V_{ter}$, $V_{tpr2}$, $V_{tpr1}$). That is, the write current $I_{pg}$ can be controlled in accordance with the substantial value of the gate voltage determined in accordance with the difference between the gate voltage $V_G$ and the threshold voltage Vtm.

The current characteristic of the memory cell in the actual write sequence is represented by the curve Q1 (a dotted line)—a point M1—a curve R1 (a dashed line), when the threshold voltage is $V_{ter}$. That is, with the increase in the drain voltage $V_{DS}$, the CHE write is advanced, and when the threshold voltage $V_{tm}$ of the memory cell is increased (the point M1), the write current $I_{pg}$ begins to be suppressed. Then, at the stage when the drain voltage $V_{DS}$ arrives at the $V_{DS0}$, the write operation is ended.

Similarly, when the threshold voltage is $V_{tpr2}$, it is represented by the curve Q2 (a dotted line)—a point M2—a curve R2 (a dashed line). When the threshold voltage is $V_{tpr1}$, the current characteristic of the memory cell is represented by the curve Q3 (a dotted line)—a point M3—a curve R3 (a dashed line). At this time, as mentioned above, the memory cell usually exhibits the current characteristic similar to that of the MOS transistor until the generation of the CHE writing. Thus, it is known that reduction of the control gate voltage level can decrease the current at the write state.

Figure 14:
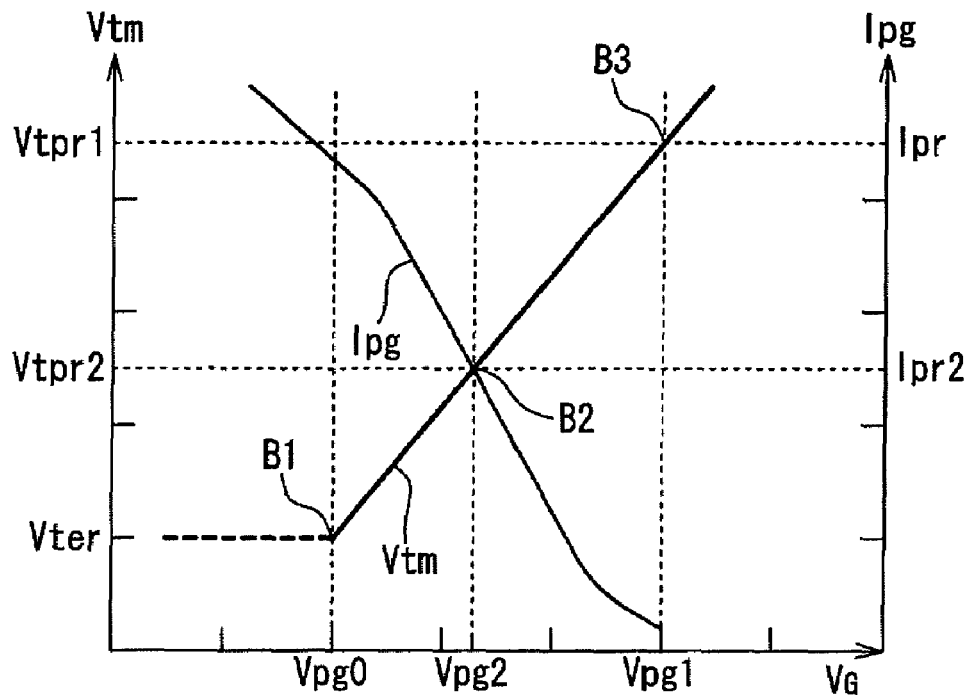
FIG. 14 is a graph showing a gate voltage dependence of a threshold voltage and a write current at a certain time of the writing operation in the nonvolatile semiconductor memory device according to the embodiment of the present invention.

FIG. 14 is a graph showing the gate voltage $V_G$ dependence of the threshold voltage $V_{tm}$ and the write current $I_{pg}$ at a certain time of the writing operation in the nonvolatile semiconductor memory device according to the embodiment of the present invention. The left vertical axis indicates the threshold voltage $V_{tm}$ of the memory cell, the right vertical axis indicates the write current $I_{pg}$ and the horizontal axis indicates the gate voltage $V_G$ (the word line voltage). At the initial state, the threshold voltage is $V_{ter}$ (B1).

In the present invention, when the threshold voltage $V_{tpr1}$ (B3) is written into the memory cell, at first, as the write operation at the first stage, the threshold voltage $V_{tpr2}$ (B2) that is the threshold voltage of the middle level is written. After that, as the write operation at a second stage, the $V_{tpr1}$ (B3) that is the threshold voltage of a write target is written.

In order to write the $V_{tpr2}$ (B2) that is the threshold voltage of the middle level, the gate voltage is required to be set to $V_{pg2}$. At this time, the write current becomes $I_{pg}$=$I_{pr2}$, and it can be set to be approximately a half of the write current $I_{pg}$=$I_{pr}$ that is required when the threshold voltage is suddenly set to the $V_{tpr1}$ (B3). However, here, since the value of the $V_{tpr2}$ that is the threshold voltage of the middle level is set to a proper value, $I_{pr2}$ (½)$I_{pr}$ is attained.

Next, in order to set the threshold voltage to the $V_{tpr1}$ (B3) that is the targeted threshold voltage in the write operation at the second stage, only the value corresponding to the difference=($V_{tpr1}$-$V_{tpr2}$) between the current threshold voltage $V_{tpr2}$ and the targeted threshold voltage $V_{tpr1}$ may be written. Since this difference is substantial $V_{tpr2}$, the write current becomes $I_{pg}$=$I_{pr2}$ even at the second stage from FIG. 14. That is, even in the write operation at the second stage, it can be set to approximately a half of the write current $I_{pg}$=$I_{pr}$ that is required when the threshold voltage is suddenly set to the $V_{tpr1}$ (B3). However, since the threshold voltage is already $V_{ptr2}$, the gate voltage is required to be set to $V_{pg1}$. This is because at this time, as the MOS transistor, the effective gate voltage of the memory cell becomes approximately ($V_{pg1}$-$V_{pg2}$)≈$V_{pg2}$.

Figure 10:
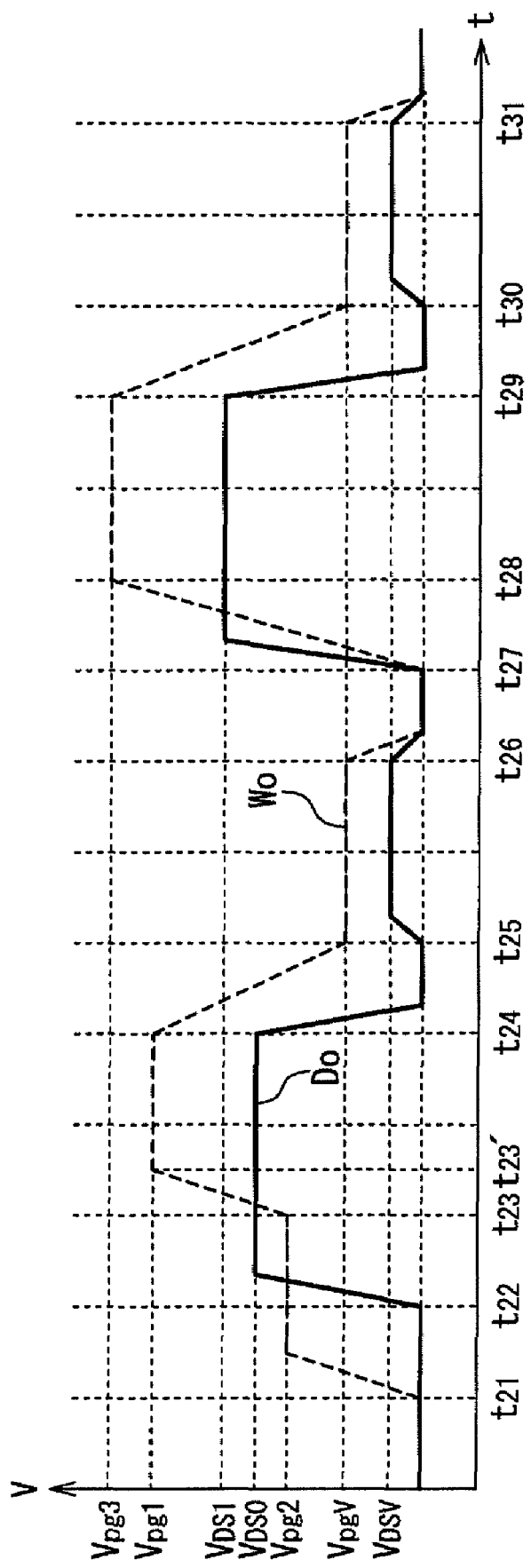
FIG. 10 is a timing chart showing a write operation in the nonvolatile semiconductor memory device according to the embodiment of the present invention.
Figure 11:
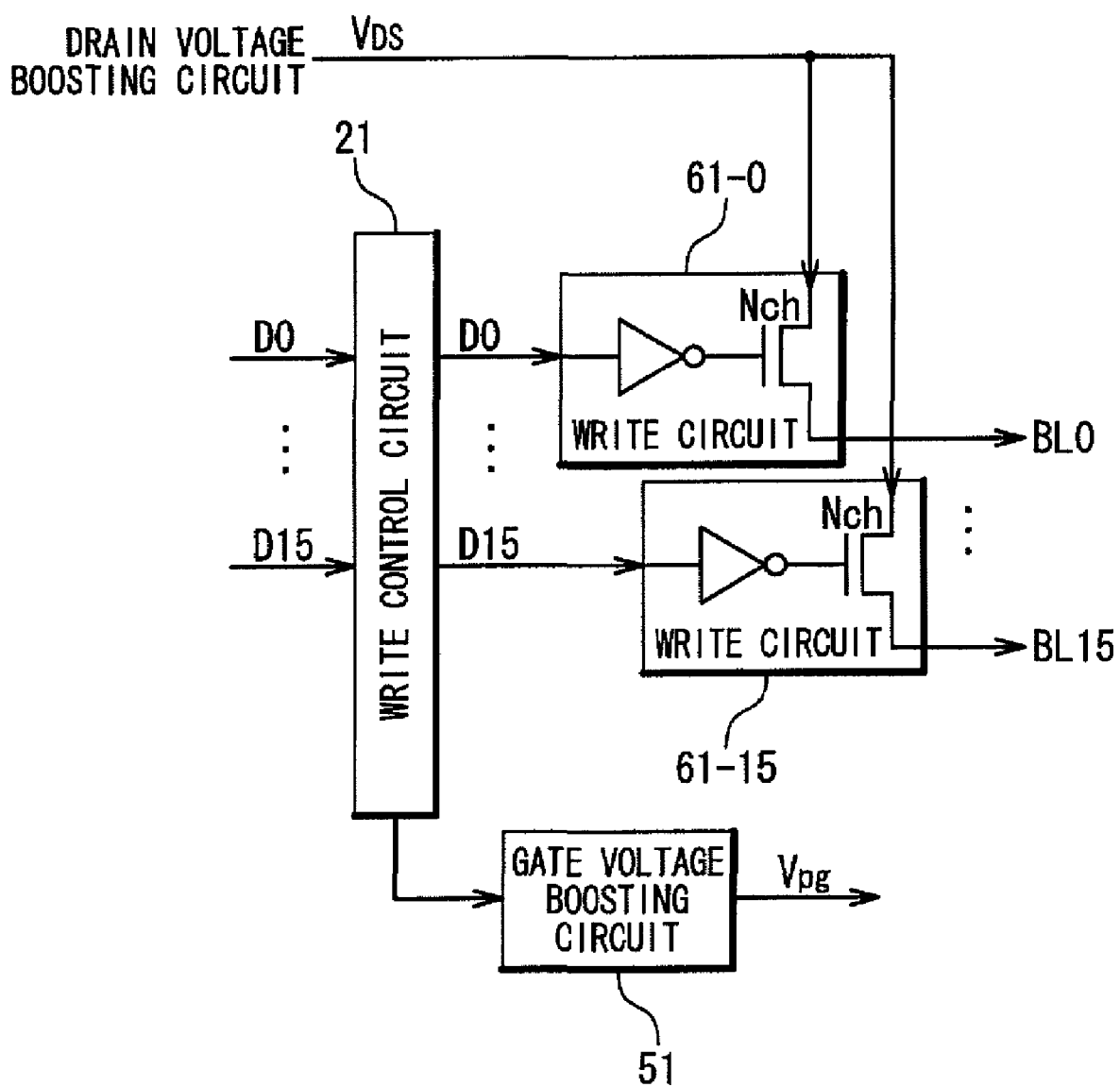
FIG. 11 is a block diagram showing a part of the configuration in FIG. 9.
Figure 12:
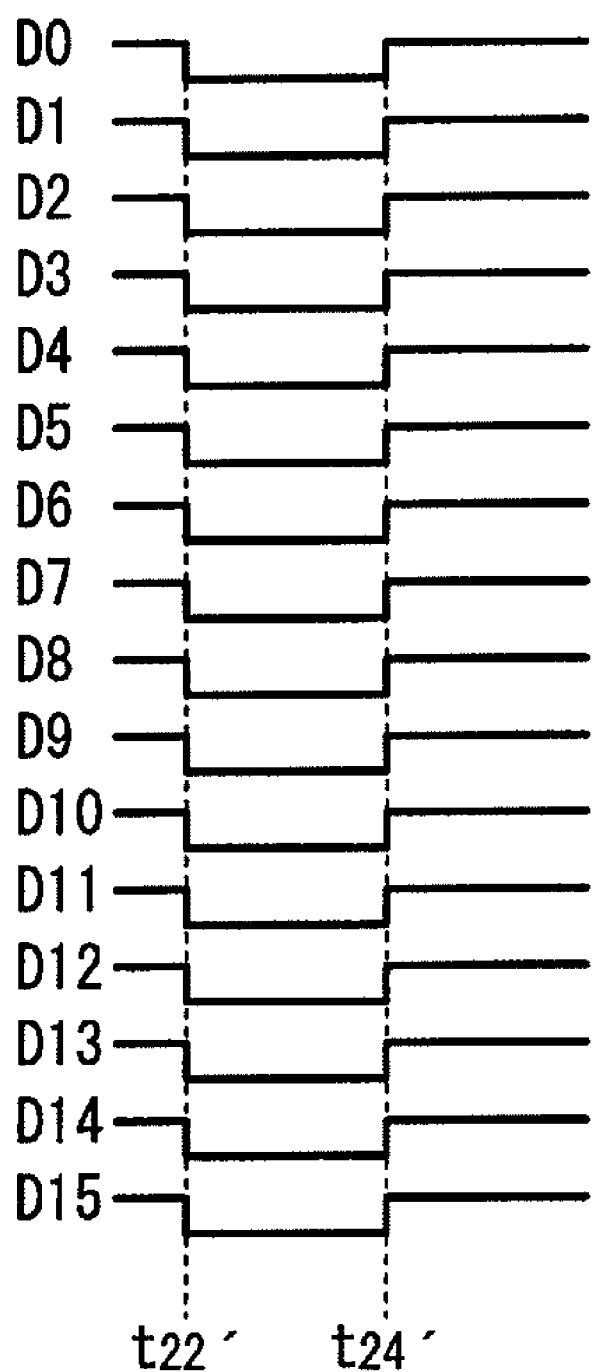
FIG. 12 is a diagram showing timing charts of the write operation of the write data signals in FIG. 9.

The writing operation of the nonvolatile semiconductor memory device of the present invention will be described below. Here, a case that the write operation is performed in two stages will be described as an example. FIG. 10 is a diagram showing timing charts of the write operation in the nonvolatile semiconductor memory device according to the embodiment of the present invention. The vertical axis indicates voltage, and the horizontal axis indicates times. A curve W₀ (dashed line) indicates a change of voltage applied to the word line, namely, the control gate of the memory cell. A curve D₀ (solid line) indicates change of voltage applied to the bit line, namely, the drain of the memory cell. FIG. 11 is a block diagram showing a part of the configuration of FIG. 9. FIG. 12 is a diagram showing timing charts of the write operation of the write data signals in FIG. 9.

At first, the selection memory cell is selected. Prior to a time t21 (FIG. 10), the write control circuit 21 of the control circuit 10 receives an address signal of the memory cells into which the write operation is performed, and write data signals D0 to D15. The write control circuit 21 of the control circuit 10 outputs the address signal of the memory cells and the write data signals D0 to D15 to the address & data buffer 8 and outputs the control signal to the power supply circuit 5. The address & data buffer 8 outputs the address signal to the decoder 3. The row decoder 31 of the decoder 3 selects as the selection word line, one from the plurality of word lines in the memory cell array 2 in accordance with the address signal. Also, the column decoder 32 of the decoder 3 outputs the column address signal to the column switch circuit 4 in accordance with its address signal. The column switch circuit 4 selects as the selection bit line, one from the plurality of bit lines in each of the plurality of regions 2-1 to 2-16 in accordance with the address signal. Consequently, the plurality of selection memory cells for 16 bits are selected at a same time. The address & data buffer 8 further outputs the data signals D0 to D15 to the write circuit 7.

(1) The write operation the first stage is performed.

Prior to the time t21 (FIG. 10), as mentioned above, the write control circuit 21 supplies the control signal to the power supply circuit 5, in order to perform the write operation at the first stage on the data signals D0 to D15.

At the time t21 (FIG. 10), the gate boosting circuit 51 of the power supply circuit 5 applies the gate voltage or write voltage $V_{pg2}$ that is a positive voltage, e.g., 4.5 V, to the control gate of the selection memory cell through the column decoder 3 and the selection word line Ws in accordance with the control signal.

Between the times 22' and t24' (in FIG. 12, corresponding to a part between the times t22 and t24 in FIG. 10), the write control circuit 21 supplies the data signals D0 to D15 shown in FIG. 12 to the write circuits 61-0 to 61-15. Thus, as shown in FIG. 11, in the write circuits 61-0 to 61-15 to which the data signals D0 to D15 are supplied, their N channel transistors are turned on, and the drain boosting circuit 52 and the selection bit lines BL1 to BL15 are connected through the write circuits 61-0 to 61-15.

At the time t22 in FIG. 10, the drain boosting circuit 52 of the power supply circuit 5 applies the drain voltage $V_{DS0}$ that is the positive voltage, e.g., 5 V, to the drains of the selection memory cells through the write circuits 61-0 to 61-15, the column switch circuit 4 and the selection bit lines BL1 to BL15 in accordance with the control signal. The source line is still grounded.

From these steps, between the times t22 and t23 in FIG. 10, the gate voltage $V_{pg2}$ becomes 4.5 V, and the drain voltage $V_{DS0}$ becomes 5 V. As mentioned above, the write operation at the first stage is performed on the selection memory cells. Here, the predetermined threshold voltage is written to the memory cells for not 8 bits but 16 bits simultaneously at one time.

At this time, the gate voltage or write voltage $V_{pg2}$ is set such that the value of the write current $I_{pg}$ sent to the memory cell is approximately a half of the conventional write current. For example, it is set to be approximate a half of the conventional gate voltage or write voltage $V_{pg1}$. Thus, the current drive performance of the power supply circuit 5 may be half. Therefore, without any increase in the performance of the power supply circuit 5, the write operation at the first stage can be performed on the memory cells simultaneously at one time for 16 bits that are equal to two times those of the conventional case.

(2) Next, the write operation t the second stage is performed.

Prior to the time t23 (FIG. 10), the write control circuit 21 supplies the control signal to the power supply circuit 5, in order to perform the write operation t the second stage on the data signals D0 to D15.

At the time t23 in FIG. 10, the gate boosting circuit 51 of the power supply circuit 5 applies the gate voltage or write voltage $V_{pg1}$ that is the positive voltage, e.g., 9.0 V, to the control gates of the selection memory cells through the row decoder 3 and the selection word line W in accordance with the control signal.

Between the times t22' and t24' (FIG. 12, corresponding to a portion between the times t22 and t24 in FIG. 10), the write control circuit 21 continues to supply the data signals D0 to D15 shown in FIG. 12 to the write circuits 61-0 to 61-15. Thus, as shown in FIG. 11, in the write circuits 61-0 to 61-15 to which the data signals D0 to D15 are supplied, their N channel transistors are kept on, and the drain boosting circuit 52 and the selection bit lines BL1 to BL15 continues to be still connected through the write circuits 61-0 to 61-15.

Between the times t23 and t24 in FIG. 10, the drain boosting circuit 52 of the power supply circuit 5 continues to apply the drain voltage $V_{DS0}$ that is the positive voltage, e.g., 5 V, to the drains of the selection memory cells through the write circuits 61-0 to 61-15, the column switch circuit 4 and the selection bit lines BL1 to BL15 in accordance with the control signal. The source line is still grounded.

From these steps, between the times t23' and t24 in FIG. 10, the gate voltage $V_{pg1}$ becomes 9.0 V, and the drain voltage $V_{DS0}$ keeps 5 V. As mentioned above, the write operation at the second stage is performed on the memory cell. Also, in this case, the target threshold voltage is written to the memory cells for not 8 bits but 16 bits simultaneously at one time. Thus, the data is written.

Here, the gate voltage or write voltage $V_{pg1}$ becomes similar to the conventional gate voltage. However, in the memory cell, it is written to the predetermined threshold voltage in the write operation at the first stage. Thus, the difference between the gate voltage $V_{pg1}$ and the predetermined threshold voltage is substantially applied to the channel region. Thus, the value of the write current $I_{pg}$ sent to the memory cell becomes approximately a half of the conventional write current, which will be described later. Hence, since the current drive performance of the power supply circuit 5 may be half, the write operation at the second stage can be performed on the memory cells for 16 bits that are equal to two times the conventional case.

(3) The verification is performed after the write operation at the second stage. Between the times t25 and t26, the sequence of the verification is performed on the selection memory cells to which the data is written. The sense amplifier circuit 7 detects whether or not each of the memory cells arrives at the desirable threshold voltage, and outputs the detection result to the control circuit 10 through the address & data buffer 8. Since the operations of the respective units in the verification are similar to the conventional case, their detailed description is omitted. In the verification, the current flowing through the memory cell is little. Thus, without any change in the current drive performance of the power supply circuit 5, the verification can be performed on the memory cells for 16 bits that are equal to two times the conventional case at one time, in a same time as the conventional case.

Since the verification is not performed between the write operation at the first stage and the write operation at the second stage, the performing of the verification once is sufficient. Its one-time verification can be performed within the same time as the conventional case. Thus, the time necessary for the verification can be reduced to a half of the conventional case.

(4) If there is a selection memory cell that does not arrive at the target threshold voltage, a re-write operation is performed on only the selection memory cell. In this case, the one-time write operation is performed. The sense amplifier circuit 10 performs a re-write sequence in accordance with the detection result from the address & data buffer 8. Between the times t28 and t29, the power supply circuit 5 applies a gate voltage or write voltage $V_{pg3}$ that is the positive voltage, e.g., 9.5 V, to the control gate of the selection memory cell through the decoder 3 and the selection word line in accordance with the control signal from the control circuit 10. On the other hand, the write circuit 6 uses the power supply circuit 5 in accordance with the data from the address & data buffer 8, and applies a drain voltage $V_{DS1}$ that is the positive voltage, e.g., 5.5 V, to the drain of the selection memory cell through the column switch circuit 4 and the selection bit line. The source line is grounded. However, the gate voltage is $V_{pg3}>V_{pg1}$. The drain voltage is $V_{DS1}>V_{DS0}$. Thus, the target threshold voltage can be surely written to the selection memory cell. However, it may be performed such that at least one of the gate voltage and the drain voltage has the value ($V_{pg1}$, $V_{DS0}$) at the time of the write operation at the second stage. In that case, the current consumption may be little.

Here, the gate voltage or write voltage $V_{pg1}$ or $V_{pg3}$ is equal to or more than the conventional gate voltage. However, the selection memory cell is written to the predetermined threshold voltage or more and approximately close to the target threshold voltage in the write operation at the second stage. Thus, the difference between the gate voltage $V_{pg1}$ or $V_{pg3}$ and the threshold voltage close to the target threshold voltage is substantially applied to the channel region. Therefore, the value of the write current $I_{pg}$ supplied to the selection memory cell becomes much smaller than the conventional write current. Accordingly, without any lack of the current drive performance of the power supply circuit 5, the re-write operation can be performed on the memory cells for 16 bits, which are equal to two times the conventional case, simultaneously at one time.

(5) After that, between the times t30 and t31, the verification is performed after the re-write operation. The verification operation is as indicated in the foregoing (3). After that, as necessary, the above (4) and (3) are repeated. Also, at a certain stage, if there is the selection memory cell that does not arrive at the target threshold voltage, a signal indicating a trouble of the selection memory cell may be outputted.

As mentioned above, the write operation of the nonvolatile semiconductor memory device according to the embodiment of the present invention is performed.

In the present invention, for the power supply circuit 5, the write current for the number of memory cells to be simultaneously written is assumed, and its current drive performance is defined. According to the writing method of the present invention, for the power supply circuit 5 having the same current drive performance, the write operation can be performed on the memory cells of at least two times at a same time.

In the present invention, when the data is written, its word line is boosted to the desirable write voltage level in at least two stages. Thus, the write current in each stage is suppressed. Consequently, without any increase in the size of the conventional inner power supply circuit, the writ operation can be performed on many cells.

In the above-mentioned embodiment, the gate voltage is boosted to the desirable voltage in the two stages. However, it may be boosted in many stages (n stages: n>2). In that case, the gate voltage in each stage is preferably set such that the write current in each stage is 1/n of the write current when it is boosted to the desirable voltage at one time. Thus, the value of the write current can be minimized.

It should be noted that in the nonvolatile semiconductor memory device described in Japanese Laid Open Patent Application (JP-P2005-235287A), the voltage of the control gate is boosted in multiple stages. This is because even if the element characteristic has a variation, the desirable threshold voltage is intended to be suitably written to all of the memory cells. That is, each time performance of the write operation, the verification is always performed, and the process for the increase of the voltage of the control gate for one step, the write operation, and the verification operation are repeatedly performed on the memory cell to which the data (threshold voltage) is not correctly written, until the data is correctly written. That is, the verification is required to be always performed each time of the write operation. In the present invention, the voltages of the multiple stages are set to the voltage between the storage levels or a middle level, and a voltage of the storage level. Thus, since the voltage does not correspond to the storage level in the write operation of the voltage between the storage levels, the performance of the verification is not required. The verification is performed only after the write operation to the final voltage corresponding to the storage level. That is, the number of times of the verification may be little as compared with the nonvolatile semiconductor memory device disclosed in Japanese Laid Open Patent Application (JP-P2005-235287A).

What is claimed is:

1. A nonvolatile semiconductor memory device comprising: a memory cell array configured to have a plurality of nonvolatile memory cells arranged in a matrix;
   a selecting section configured to select as selection memory cells, at least two of said plurality of nonvolatile memory cells from said memory cell array; and
   a write section configured to apply a first voltage and a second voltage larger than said first voltage to said selection memory cells in a first time period and a second time period after said first time period in a write cycle, respectively.

2. The nonvolatile semiconductor memory device according to claim 1, wherein said write section writes said first voltage into a first selection memory cell of said selection memory cells by applying a first gate voltage to said first selection memory cell, and then writes said second voltage into a second selection memory cell of said selection memory cells by applying a second gate voltage to said second selection memory cell.

3. The nonvolatile semiconductor memory device according to claim 2, wherein the write of said first voltage and the write of said second voltage are performed without performing a verification between the write of said first voltage and the write of said second voltage.

4. The nonvolatile semiconductor memory device according to claim 2, wherein said write section applies said first voltage such that a write current flowing through said first selection memory cell when said first voltage is written in said first selection memory cell is a half of a write current flowing through said second selection memory cell when said second voltage is written in said second selection memory cell in one time.

5. The nonvolatile semiconductor memory device according to claim 1, wherein when the write into said selection memory cells does not raise a threshold voltage of at least one selection memory cell of said selection memory cells to a target threshold voltage, based on a verification of said selection memory cells, said write section sets a post-verification voltage to be higher than said first voltage in the write immediately before said verification and writes said post verification voltage in said at least one selection memory cell of said selection memory cells.

6. The nonvolatile semiconductor memory device according to claim 1, wherein when the write into said selection memory cells does not raise a threshold voltage of at least one selection memory cell of said selection memory cells to a target threshold voltage, based on a verification of said selection memory cells, said write section sets a post-verification voltage to be higher than a voltage in the write immediately before said verification and writes said post verification voltage in said at least one selection memory cell of said selection memory cells.

* * * * *